United States Patent [19]

Komatsu

[11] Patent Number: 4,879,252

[45] Date of Patent: Nov. 7, 1989

[54] SEMICONDUCTOR DEVICE AND A METHOD OF MANUFACTURING THE SAME

[75] Inventor: Shigeru Komatsu, Kitakyushu, Japan

[73] Assignee: Kabushiki Kaisha Toshiba, Kawasaki, Japan

[21] Appl. No.: 148,332

[22] Filed: Jan. 25, 1988

[30] Foreign Application Priority Data

Jan. 27, 1987 [JP] Japan .................... 62-15223

[51] Int. Cl.$^4$ .......................... H01L 21/265
[52] U.S. Cl. ........................ 437/31; 437/32; 437/33; 437/150; 437/162; 148/DIG. 10; 148/DIG. 11; 148/DIG. 123; 148/DIG. 124; 357/34; 357/35; 357/59; 156/628
[58] Field of Search .............. 437/31, 32, 33, 160, 437/162, 186, 203, 233, 150, 151, 152, 153, 154; 148/DIG. 9, DIG. 10, DIG. 11, DIG. 30, DIG. 82, DIG. 83, DIG. 123, DIG. 124, DIG. 78; 357/59 H, 34, 43, 35; 156/628

[56] References Cited

U.S. PATENT DOCUMENTS

| | | | |
|---|---|---|---|
| 3,980,507 | 9/1976 | Carley | 156/628 |
| 4,026,733 | 5/1977 | Owen, III et al. | 156/628 |
| 4,057,895 | 11/1977 | Ghezzo | 156/628 |
| 4,090,915 | 5/1978 | Keller | 156/628 |
| 4,092,209 | 5/1978 | Ipri | 156/628 |
| 4,157,269 | 6/1979 | Ning et al. | 357/59 H |
| 4,201,603 | 5/1980 | Scott, Jr. et al. | 156/628 |
| 4,239,559 | 12/1980 | Ito | 156/628 |
| 4,431,460 | 2/1984 | Barson et al. | 437/31 |
| 4,495,010 | 1/1985 | Kranzer | 437/162 |
| 4,735,912 | 4/1988 | Kawakatsu | 437/33 |
| 4,735,916 | 4/1988 | Homma et al. | 437/162 |

FOREIGN PATENT DOCUMENTS 0140464 10/1979 Japan .................... 156/628
60-72268 4/1985 Japan .
60-81862 5/1985 Japan .

OTHER PUBLICATIONS

High–Speed Self–Aligned Polysilicon Emitter/Base Bipolar Devices Using Boron and Arsenic Diffusion through Polysilicon, H. Park, T. Yamaguchi, K. Boyer, G. Eiden, C. Clawson, S. Yu, and J. Sachitano, "Extended Abstracts of the 18th (1986 International) Conference on Solid State Devices and Materials", Tokyo, 1966, pp. 729–731.

Primary Examiner—Brian E. Hearn
Assistant Examiner—M. Wilczewski
Attorney, Agent, or Firm—Finnegan, Henderson, Farabow, Garrett, and Dunner

[57] ABSTRACT

The method of manufacturing a semiconductor device according to the present invention comprises the step of forming an opening in use for forming an emitter region. This step uses the independent etching characteristics of N and P type polysilicons to simplify the opening forming process, which is very complicated in the conventional method. To be more specific, the impurity doped in the first polysilicon layer at a high concentration is diffused into the second polysilicon layer adjacent to the first polysilicon layer. When the impurity doped in the first polysilicon layer is diffused into the second polysilicon layer, the diffused impurity dominantly determines the conductivity type of that portion of the second polysilicon layer, into which the impurity is diffused. Therefore, one of the first polysilicon layer and the second polysilicon layer portion is etched by a solution, independently of the other. Since they are etched independently, a desired gap can be formed between the end portion of the first plysilicon layer and the emitter electrode.

6 Claims, 9 Drawing Sheets

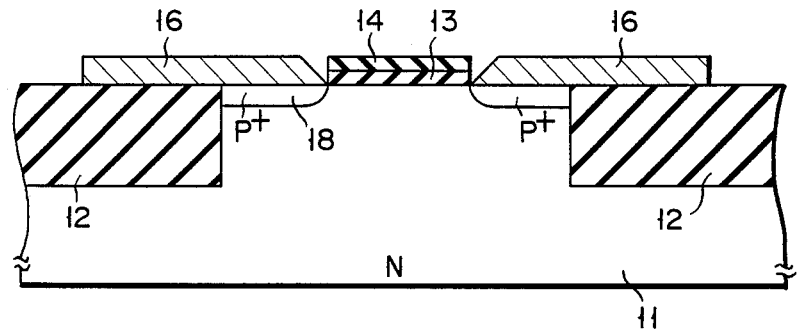
F I G. 8D
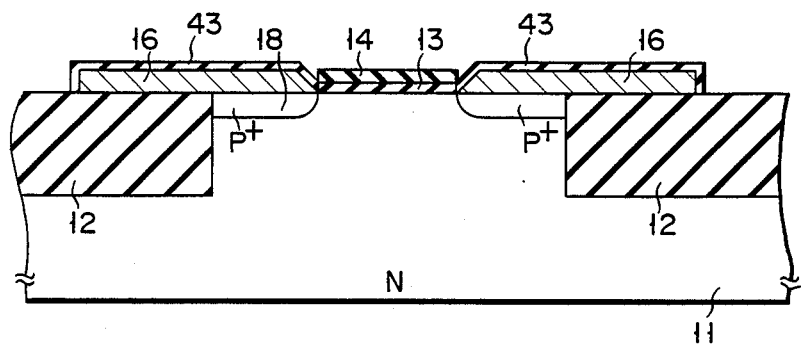
F I G. 8E
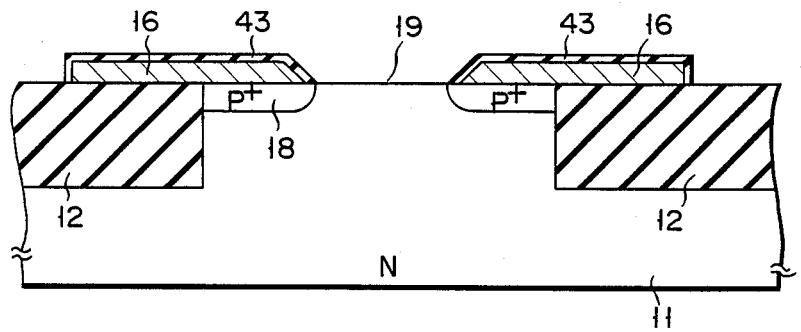
F I G. 8F

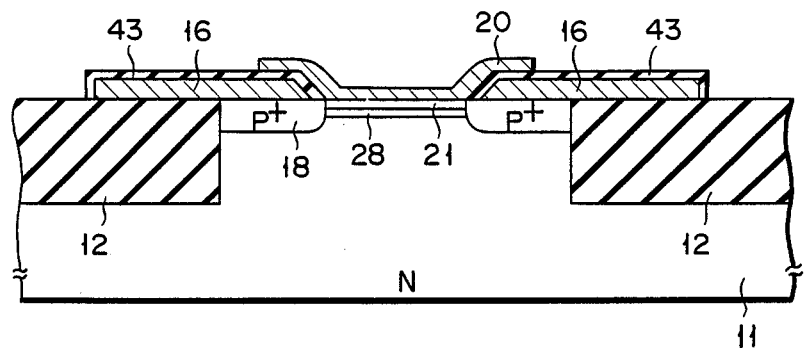
F I G. 8I
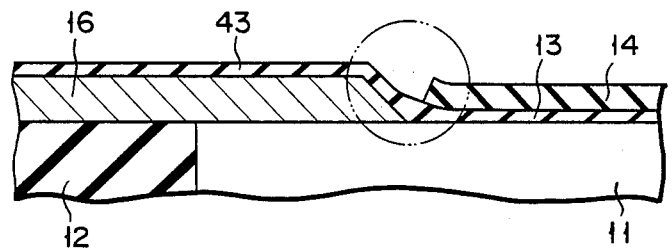
F I G. 9
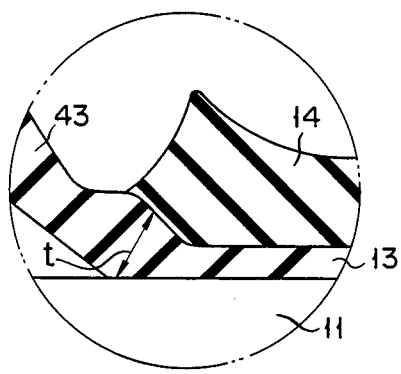
F I G. 10

SEMICONDUCTOR DEVICE AND A METHOD OF MANUFACTURING THE SAME

BACKGROUND OF THE INVENTION

This invention relates to a semiconductor device and a method of manufacturing the same, and more particularly, to the improvements of the base and emitter regions, the base leading electrode and the emitter leading electrode of a high speed, and high frequency bipolar transistor.

The recent intensive efforts to improve the performances of the bipolar transistor operating at high frequency or at high speed are found in the microfabrication technique and the self-aligning technique, which are both for reducing the parasitic capacitance possibly existing between the emitter and base, and between the base and collector, and for reducing the base resistance. In recent transistors, a polysilicon layer is used to form the base leading electrode and the emitter leading electrode, and an emitter region diffusing source. Those recent transistors are, for example, SST (super self-aligned process technology) transistors, self-aligned transistors fabricated by using RIE (reactive ion etching) technique, PSA (polysilicon self-aligned) transistors, APSA (advanced PSA) transistors, BEST (base emitter self-aligned technology) transistors, and SICOS (sidewall base contact structure) transistors. The SST transistor is fabricated through a sequence of process steps shown in FIGS. 1A to 1D. In the figure, reference symbols 101a to 101c designate $SiO_2$ layers; 102a and 102b $SiO_2$ layers; 103B a polysilicon layer doped with boron; 103As a polysilicon layer doped with arsenic; 104E an emitter electrode; 104B a base electrode; 104C a collector electrode. A base leading electrode is formed by polysilicon layer 103B. An emitter leading electrode is formed by polysilicon layer 103As. Polysilicon layer 103As is also used as an impurity diffusing source to form emitter region 105E. Reference symbol 105B represents a base region and 105C a collector region.

The self-aligned transistor, which is manufactured using the RIE technique, is manufactured through the process steps shown in FIGS. 2A and 2B. In the figures, reference symbols 113B is indicative of a polysilicon layer doped with boron, and reference numeral 111 designates a $SiO_2$ layer formed by the CVD (chemical vapor deposition) process. A mask with a predetermined pattern (not shown) made of photo resist is formed on the CVD $SiO_2$ layer 111. $SiO_2$ layer 111 and polysilicon layer 113B are partially etched away by RIE process to form a hole which communicates with the region of the substrate where the emitter is to be formed. Then, the side portion of polysilicon layer 113B is etched by an etching solution of HF : $HNO_3$ : $CH_3COOH = 1 : 3 : 8$. Following the etching, the surface layer of the structure is oxidized and $SiO_2$ layer 111 is partially etched away by RIE process to form a hole which communicates with the emitter forming region. Reference symbol 106 denotes an $SiO_2$ layer, and reference symbol 107 denotes a base region.

In FIG. 3 showing a PSA transistor as an example of the self-aligned transistor with a polysilicon layer, polysilicon layer 123B forms a base region leading electrode. Polysilicon layer 123E forms an emitter region leading electrode, and polysilicon layer 123C forms a collector region leading electrode. Polysilicon layers 123E and 123C are also used as diffusing sources for forming emitter region 125E and collector region 125C by doping the emitter and collector regions with impurity. In other words, emitter region 125E and collector region 125C are formed by the self-align method, using the polysilicon layers 125E and 125C to reduce the transistor area. Reference symbols 125B, 125E, and 125C denote a base region leading electrode, an emitter region leading electrode, and a collector region leading electrode, respectively.

An APSA transistor, which is the PSA transistor improved to operate at a high speed, is shown in FIG. 4. As shown, as in the case of the PSA transistor, the base leading electrode made of polysilicon layer 133B is extended from that portion 135B of the P base region, which is around emitter region 135E (as viewed from the top or bottom in the drawing). An emitter contact opening and a base contact opening are formed by using a mask (not shown). Reference symbols 134E, 134B and 134C are representative of emitter, base, and collector electrode layers, respectively.

The BEST transistor is formed through a manufacturing process shown in FIGS. 5A and 5B. In the process, when the surface region of polysilicon layer 143 formed on oxide layer 146 for separating individual elements is oxidized by using $Si_3N_4$ layer 142, the positions of the emitter contact opening and the base contact opening are defined. Reference symbols 105B, 105E, and 105C denote a base electrode, an emitter electrode, and a collector electrode, respectively.

In the SICOS transistor, the base leading electrode of the polysilicon extends from the side wall of the base region 155B, as shown in FIGS. 6A to 6D. In the manufacture thereof, an epitaxial growth layer is formed on silicon substrate 150. Further layered on the epitaxial growth layer are first $SiO_2$ layer 151a, first $Si_3N_4$ layer 152a, boron doped polysilicon layer 153, second $Si_3N_4$ layer 152b, and second $SiO_2$ layer 151b. The multilayer is dry-etched, except the portion where emitter region 155E is to be formed. The epitaxial growth layer and the multilayer are further subjected to the etching to remove the side portion thereof (FIG. 6A). Then, the structure is oxidized to form a $Si_3N_4$ layer (not shown) on the surface region of the structure. Thereafter, the structure is subjected to the dry etching process to remove that portion of the $Si_3N_4$ layer which is on the epitaxial layer. Further, it is subjected to the selective oxidation to form a thick $SiO_2$ layer on the epitaxial layer. Succeedingly, that portion of the $Si_3N_4$ layer which is on the side wall of the multilayer is removed. Thereafter, impurity doped polysilicon layer 163 is formed over the entire surface of the structure, and is patterned to form base leading electrode. Reference symbols 155E and 155C denote an emitter electrode, and a collector electrode, respectively.

As described above, transistors other than the PSA and APSA transistors are manufactured using the RIE technique, which is complicated and instable. This indicates a low yield of these transistors. In the case of the SST transistor, since the self-align process is frequently used, the number of masks used in the process from the formation of base region 105B to the formation of emitter region 105E is very small, only 2, when comparing with that (4 to 5) of the general bipolar transistor. In this respect, the number of formations of the resist pattern is reduced to improve the cost performance. However, the self-align technique involves one problem to be solved. In FIG. 7, this problem resides in the formation of base leading electrode 173B and emitter region 175E, and in the formation of insulating layer 171 for insulating emitter leading electrode 173E from base leading electrode 173B. The formation of this insulating layer 171 is very complicated in such a way that base leading electrode 173B is partially oxidized or a CVD-SiO₂ layer is formed, and it is processed by the RIE technique to remain that portion 171a thereof which is on the side wall of base leading electrode 173B.

In FIG. 7, reference symbol 175E designates an emitter region, and 175B and 177 base regions, and 176 an SiO₂ layer.

As described above, the prior art semiconductor device and its manufacturing method can provide almost satisfactory electrical characteristics, but need many masks during manufacturing. Use of many masks makes the manufacturing process complicated and the resultant products more expensive.

SUMMARY OF THE INVENTION

Accordingly, an object of the invention is to provide a method of manufacturing a semiconductor device free from the above-mentioned problems of prior art practices.

One of the major characteristics of the method of manufacturing a semiconductor device according to the present invention resides in the step of forming an opening in use for forming an emitter region. This step uses the independent etching characteristics of N and P type polysilicons to simplify the opening forming process, which is very complicated in the conventional method. To be more specific, in the case of the semiconductor structure shown in FIGS. 8C and 8D, the impurity doped in the first polysilicon layer at a high concentration is diffused into the second polysilicon layer adjacent to the first polysilicon layer. When the impurity doped in the first polysilicon layer is diffused into the second polysilicon layer, the diffused impurity dominantly determines the nature, i.e., the conductivity type, of that portion of the second polysilicon layer, into which the impurity is diffused. Therefore, one of the first polysilicon layer and the second polysilicon layer portion is etched by a solution, independently of the other. Since they are etched independently, a desired gap can be formed between the end portion of the first polysilicon layer and the emitter electrode.

To realize the above object, there is provided a method of manufacturing a semiconductor device comprising the steps of:

forming an insulating layer in a semiconductor substrate, for defining a semiconductor region of a first conductivity type separated from other semiconductor regions;

forming a first silicon dioxide layer, a silicon nitride layer and a first polysilicon semiconductor layer of the first conductivity type and a high impurity concentration on said semiconductor region in a successive manner, and patterning these layers to form a layered structure on an emitter forming region;

forming a second polysilicon semiconductor layer on the semiconductor structure, and patterning the second layer;

implanting impurity ions of a second conductivity type into said second polysilicon semiconductor layer;

thermally heating the semiconductor structure to diffuse the impurity implanted in said second polysilicon semiconductor layer into said semiconductor region, so that a first region of the second conductivity type, which is in contact with said insulating layer and is between the insulating layer and the emitter forming region is formed in said semiconductor region, and to diffuse the impurity implanted in said first polysilicon semiconductor layer into that portion of said second polysilicon semiconductor layer, which contacts said first polysilicon semiconductor layer, to change the conductivity type of said portion of said first polysilicon semiconductor layer from said second conductivity type to said first conductivity type;

removing said first polysilicon semiconductor layer and said portion of the first conductivity type of said second polysilicon semiconductor layer;

thermally heating the semiconductor structure to form a second silicon dioxide layer o said first polysilicon layer to be thicker than said first silicon dioxide layer under said silicon nitride layer;

removing said silicon nitride layer and said first silicon dioxide layer to expose said semiconductor region;

forming a third polysilicon semiconductor layer on the semiconductor structure, and patterning the third layer;

implanting impurity ions of the second conductivity type into said third polysilicon semiconductor layer, and thermally heating the third layer to diffuse the impurity implanted therein into said semiconductor region to form a second region of the second conductivity type acting as an active base region in contact with said first region of the second conductivity type; and forming a region of the first conductivity type acting as an emitter region in a part of said second region of the second conductivity type by implanting impurity ions of the first conductivity type into said third polysilicon semiconductor layer, and thermally heating the third structure.

According to the present invention, there is further provided a method of manufacturing a semiconductor device comprising the step of:

forming a first insulating layer in a semiconductor substrate, for defining a semiconductor region of a first conductivity type separated from other semiconductor regions;

forming a second insulating layer on a portion of said semiconductor region;

forming a first polysilicon semiconductor layer of the first conductivity type on said portion of the second insulating layer, the first polysilicon semiconductor layer containing impurities at a high impurity concentration;

forming a second polysilicon semiconductor layer of a second conductivity type on said first polysilicon semiconductor layer and that portion of said semiconductor region on which said second insulating layer and said first polysilicon semiconductor layer are not formed;

thermally heating the semiconductor structure to diffuse the impurities contained in said first polysilicon semiconductor layer into that portion of said second polysilicon semiconductor layer, which is adjacent to said first polysilicon semiconductor layer, to change the conductivity type of said second polysilicon semiconductor layer portion to the first conductivity type; and removing said second polysilicon semiconductor layer portion and said first polysilicon semiconductor layer, by a common etching which does not remove that portion of said second polysilicon semiconductor layer, which is formed on said semiconductor region.

According to the present invention, there is still further provided a semiconductor device comprising:

a first insulating layer formed in a semiconductor substrate of a first conductivity type, for defining a semiconductor region separated from other semiconductor regions;

a first semiconductor layer of a second conductivity type formed in said semiconductor region and adjacent to said first semiconductor layer;

a second semiconductor layer of the first conductivity type formed in said first semiconductor layer;

a base leading electrode formed of a polysilicon layer of the second conductivity type formed on said first semiconductor layer; and an emitter leading electrode formed of a polysilicon layer of the first conductivity type formed on said second semiconductor layer.

BRIEF DESCRIPTION OF THE DRAWINGS

FIGS. 1 to 7 are sectional views showing the structures of conventional semiconductor devices, in which FIG. 3 is a sectional view showing a PSA transistor, FIG. 4 is a sectional view showing an APSA transistor, FIGS. 5A and B show sequential process steps to manufacture BEST transistors, FIG. 7 shows the side wall of a prior transistor;

FIGS. 8A through 8I are sectional views of semiconductor structures in a sequence of process steps of manufacturing a semiconductor device according to an embodiment of this invention;

FIG. 9 is a sectional view showing a key portion of the structure as manufactured by the manufacturing method according to this invention, which is found in the step shown in FIG. 8E; and FIG. 10 shows an enlarged sectional view of the key portion shown in FIG. 9.

DETAILED DESCRIPTION OF THE PREFERRED EMBODIMENT

Figure 1A:
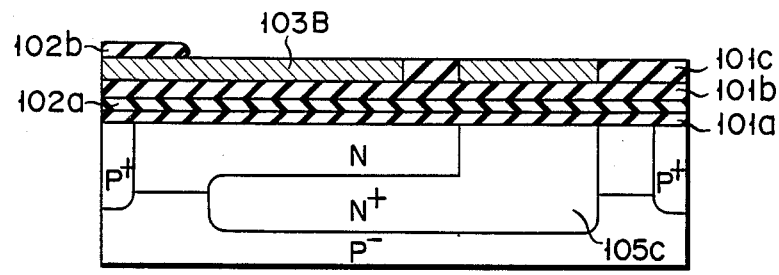
FIGS. 1A to 1D show a sequence of process steps to manufacturing SST transistors.
Figure 1B:
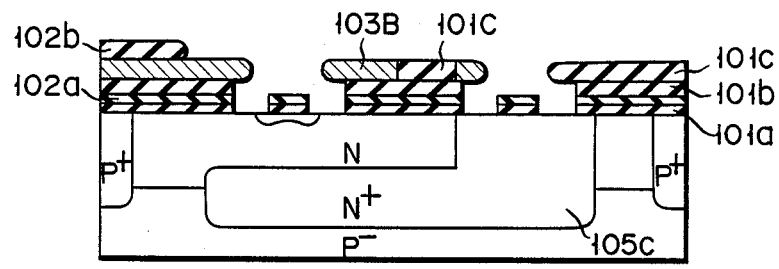
Figure 1C:
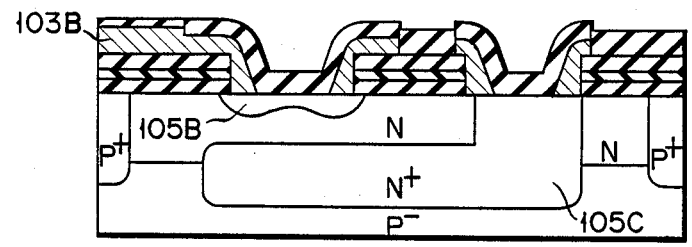
Figure 1D:
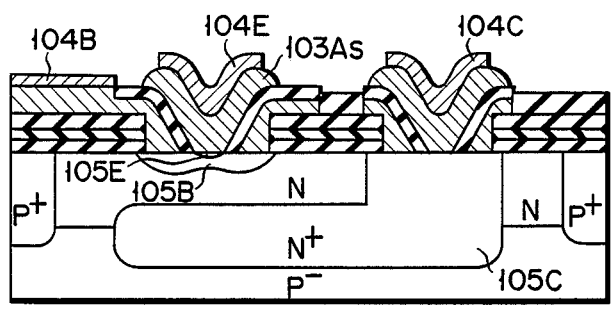
Figure 2A:
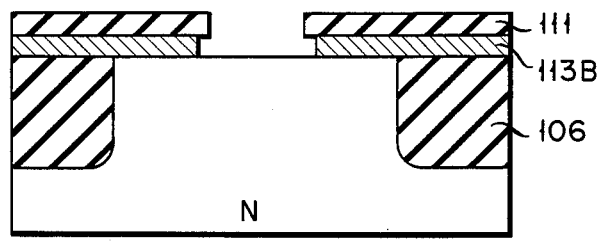
FIGS. 2A and 2B show process steps to manufacture self-align transistors using RIE process.
Figure 2B:
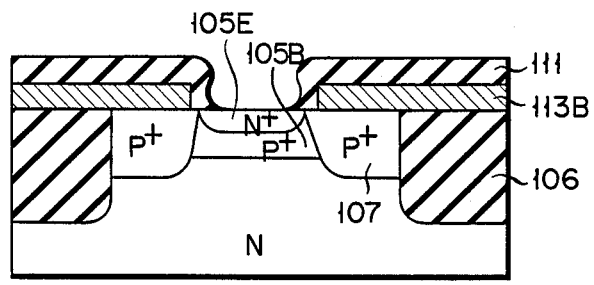
Figure 3:
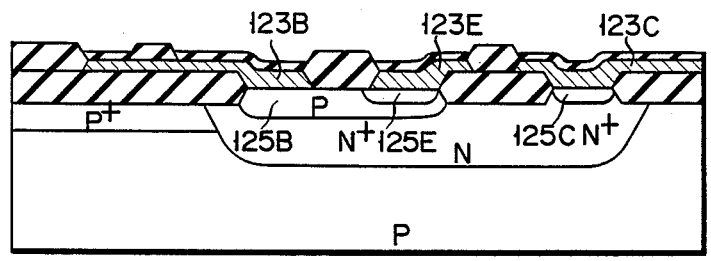
Figure 4:
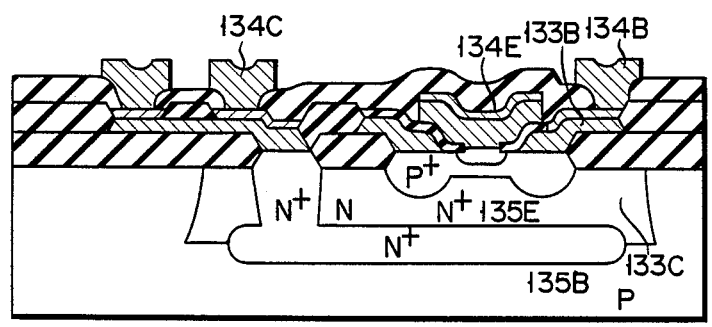
Figure 5A:
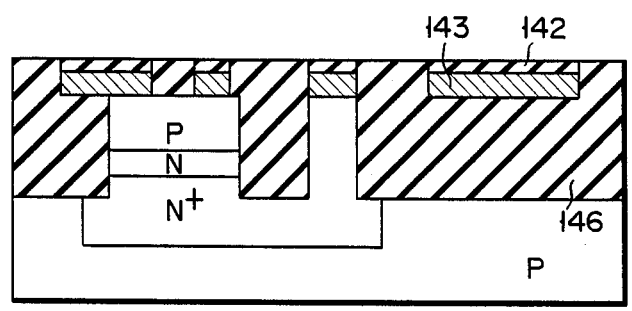
Figure 5B:
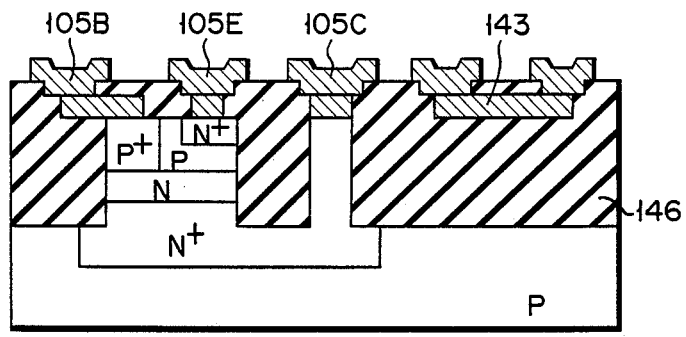
Figure 6A:
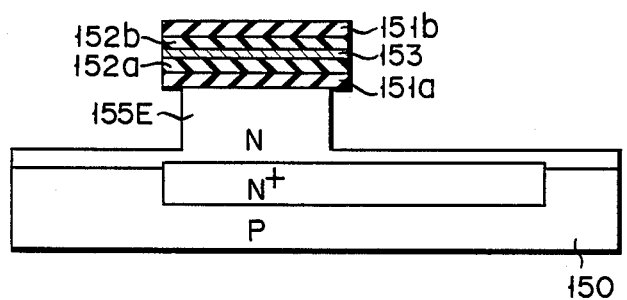
FIGS. 6A to 6D show sequential process steps to manufacture SICOS transistors.
Figure 6B:
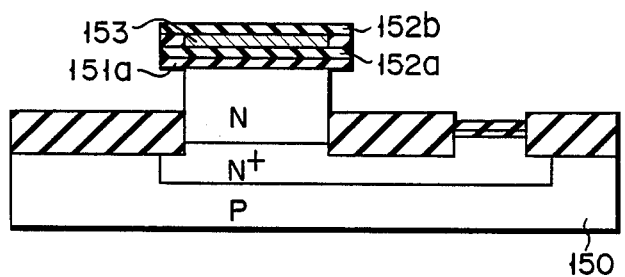
Figure 6C:
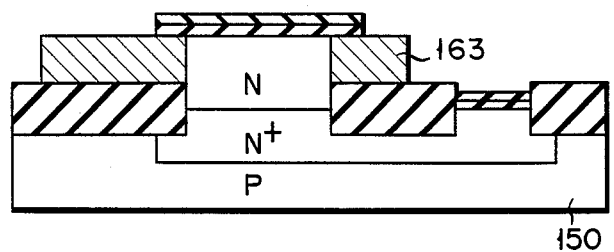
Figure 6D:
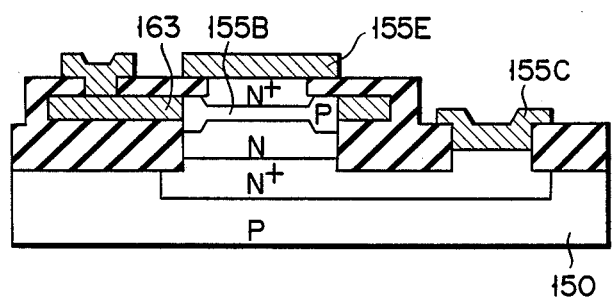
Figure 7:
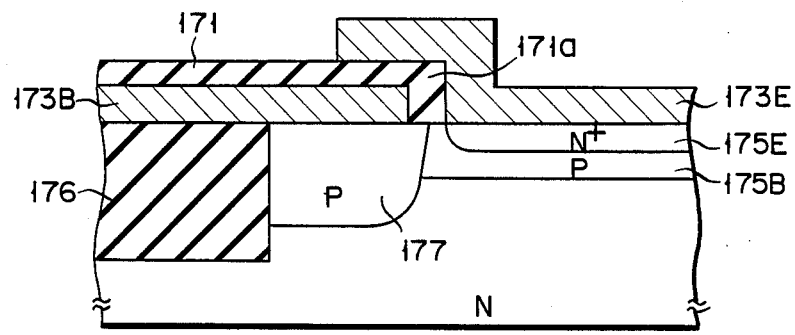
Figure 8A:
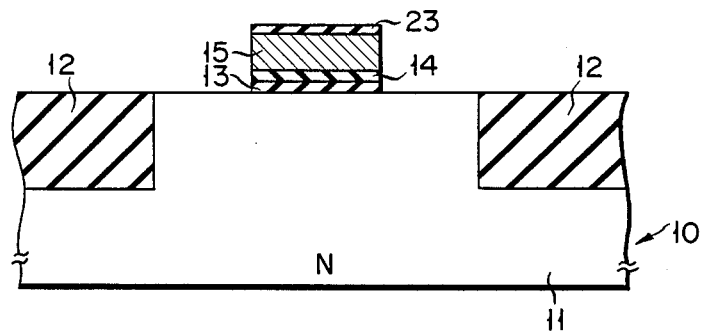
Figure 8B:
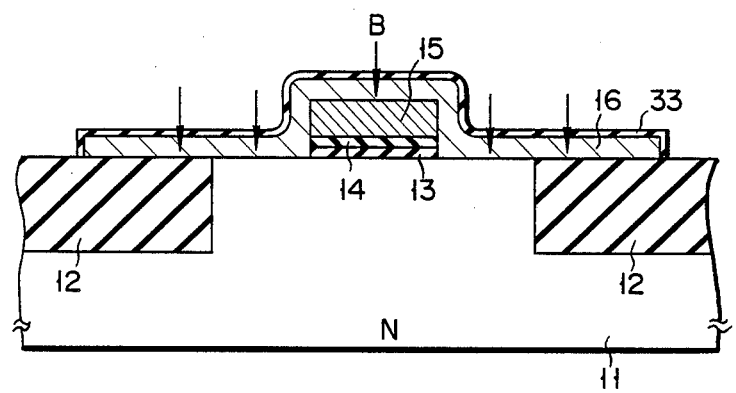
Figure 8C:
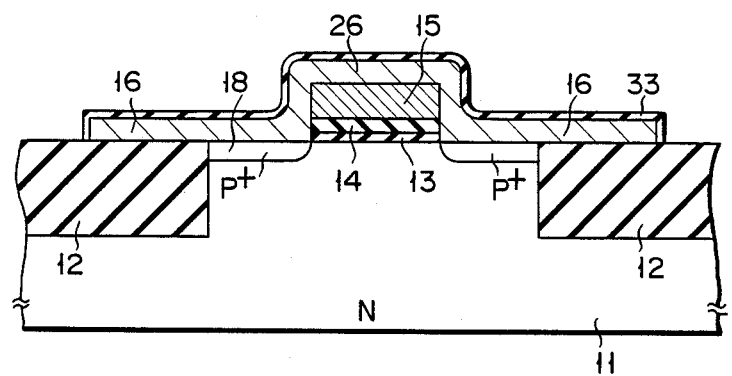
Figure 8G:
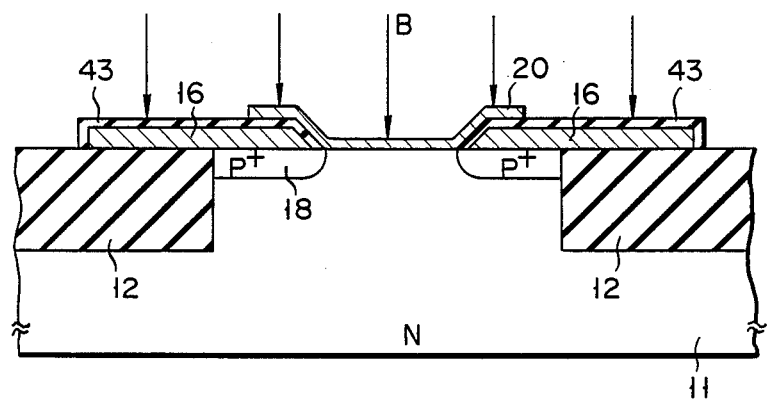
Figure 8H:
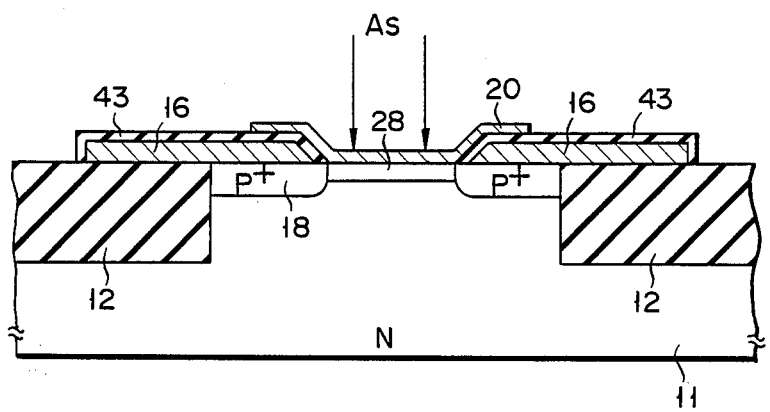

An embodiment of a method of manufacturing a semiconductor device according to this invention will be described by referring to FIGS. 8A to 8I, FIG. 9, and FIG. 10.

FIGS. 8A to 8I show cross-sectional views showing semiconductor structures at a sequence of process steps to manufacture a bipolar transistor to which a semiconductor device manufacturing method according to this invention is applied.

PROCESS 1 (FIG. 8A)

Resistivity of the N type collector region 11 of N type silicon substrate 10 is set to 0.2 to 2 ohm-centimeters. $SiO_2$ layer 12 is formed in a surface region of substrate 10 to define an element forming region spaced from other element forming regions (not shown). $SiO_2$ layer 13 is formed on the surface region of substrate 10 by thermal oxidation to be 300 to 1000 Angstroms in thickness. Subsequently, $Si_3N_4$ film 14 is formed on $SiO_2$ layer 14 to be 800 to 1000 Angstroms in thickness. In this instance, the thickness of $SiO_2$ layer 13 is selected to be 500 Angstroms, allowing for the stress which may occur in $Si_3N_4$ film. First polysilicon layer 15 is formed on $Si_3N_4$ 14 to be 3000 to 4000 Angstroms in thickness.

Following this, ions of arsenic (As) of an N type impurity are implanted into the resultant structure under the condition of 30 KeV of accelerating electric field and $1 \times 10^{16}$ atom/cm$^2$ of dosage. After the ion implantation, the structure is annealed for 30 minutes and at 900° C. in a dry $O_2$ atmosphere to activate the doped As. In this time, $SiO_2$ layer 23 is formed on first polysilicon layer 15 to be, approximately, 300 to 500 Angstroms in thickness. A resist layer (not shown) is formed on the structure. $SiO_2$ layer 23 ensures the intimate contact of the resist layer and polysilicon layer 15 during the subsequent step in which the resist layer is patterned. After the resist layer is patterned, $SiO_2$ layer 13, $Si_3N_4$ layer 14, first polysilicon layer 15 and $SiO_2$ layer 23 are patterned using the patterned resist layer as a mask.

PROCESS 2 (FIG. 8B)

After removing the portion of $SiO_2$ layer 23 left on polysilicon layer 15 by $NH_4F$ solution, second polysilicon layer 16 is formed on the structure to be 4000 to 5000 Angstroms in thickness. The second polysilicon layer is then patterned to have a given pattern, using a resist pattern as a mask. RIE method or dry chemical etching method may be used to form this polysilicon layer. Then, $SiO_2$ layer 33 is formed on polysilicon layer 16 to be 200 to 500 Angstroms in thickness in the low oxide atmosphere at 900° C. $SiO_2$ layer 33 is used as a cap for preventing an undesired scattering of impurity in the anneal to be performed later. In this case, if $SiO_2$ layer 33 has the same pattern as that of polysilicon layer 16, it is very effective to enhance the intimate contact of layer 33 with the silicon substrate. Boron ions are implanted into polysilicon layer 16 under the condition that accelerating energy is 30 to 35 KeV and dosage is $1 \times 10^{14}$ to $2 \times 10^{15}$ atom/cm$^2$. Instead of the boron ion implantation, a BSG (boron silicate glass) layer can be formed on $SiO_2$ layer, and boron can be diffused from this layer. Alternatively, a boron doped polysilicon layer can be formed on $SiO_2$ layer, and boron can be diffused from this polysilicon layer. Either alternative method is inferior to the ion implantation method in view of the control of impurity concentration.

PROCESS 3 (FIG. 8C)

Subsequently, the structure is annealed at 900° to 1000° C. in an inactive gas atmosphere, so that As (N type impurity) doped in first polysilicon layer 15 is diffused into a part of second polysilicon layer 16, which is in contact with first layer 15 to serve the part of second polysilicon layer 16 as N type region 26. In this anneal process, boron of silicon layer 16 is diffused into the silicon substrate to form a base contact region of a transistor.

PROCESS 4 (FIG. 8D)

After removing $SiO_2$ layer 33, N type region 26 and first polysilicon layer 15 are removed by KOH solution.

PROCESS 5 (FIG. 8E)

$SiO_2$ layer 43 is formed on second polysilicon layer by thermal oxidation process. Layer 43 is at least 2000 Angstroms in thickness, that is, at least four times that of $SiO_2$ layer 13. However, the layers are illustrated to have approximately the same thickness for simplicity of illustration. Such a large value is selected for the reason that the layer 43 must be left in a satisfactory thickness when $SiO_2$ layer 13 is removed in a later process step.

SiO₂ layer 43 formed by the partial oxidation process is configured as shown in FIG. 9, and a portion of the layer as enclosed by a dotted circle is illustrated in FIG. 10 in an enlarged scale. As seen from the illustration, at the end of Si₃N₄ layer 14, SiO₂ layer 43 lies under the layer 14 to provide a preferable gap "t" between the end of impurity doped polysilicon layer 16 and an emitter region to be exposed in a later process step.

PROCESS 5 (FIG. 8F)

After Si₃N₄ layer 14 is removed by a CDE (chemical dry etching) method, SiO₂ layer 13 of 500 Angstroms in thickness is removed by NH₄F solution to form opening 19 exposing the substrate and used in forming the emitter region. Since SiO₂ layer 43 on second semiconductor layer 16 is thick, at least 2000 Angstroms, it is left with thickness of at least 1000 Angstroms.

PROCESS 6 (FIG. 8G)

Polysilicon layer 20 is formed in opening 19 and contacts the substrate. Layer 20 extends on SiO₂ layer 43. Boron ions are implanted into the structure.

PROCESS 7 (FIG. 8H)

The structure is heated to cause boron in polysilicon layer 20 to be diffused into the silicon substrate (collector region), so that active base region 28 is formed in the surface region of the substrate. Arsenic ions are implanted into polysilicon layer 20 under the condition of 40 to 60 KeV of accelerating energy and $1\times 10^{15}$ to $1\times 10^{16}$ atom/cm² of dosage.

PROCESS 8 (FIG. 8I)

The resultant structure is heated at 900° to 1000° C., to form emitter region 21 on active base region 28.

The process may be the diffusion process as described by H. Park et al in their article "High-Speed Self-aligned Polysilicon Emitter/Base Bipolar Devices Using Boron and Arsenic Diffusion Through Polysilicon."; Extended Abstracts of the 18th Conference on Solid State Devices and Materials, Tokyo, 1986, pp 729–731. With the process, the active base region 28 obtained is 1500 Angstroms in thickness, emitter region 21 is approximately 500 Angstroms in thickness, and transition frequency $f_T$ is 10 GHz or more.

If a method of manufacturing a semiconductor device according to this invention is used, bipolar transistors and bipolar integrated circuits with high frequency characteristics whose transition frequency $f_T$ is at least 10 GHz can be manufactured using the number of masks equal to a minimum number of masks as required for the conventional complicated self-align technique.

What is claimed is:

1. A method of manufacturing a semiconductor device comprising the steps of:
    forming an insulating layer in a semiconductor substrate, for defining a semiconductor region of a first conductivity type separated from other semiconductor regions;
    forming a first silicon dioxide layer, a silicon nitride layer and a first polysilicon semiconductor layer of the first conductivity type and a high impurity concentration on said semiconductor region in a successive manner in the order specified, and patterning these layer to form a layered structure on an emitter forming region;
    forming a second polysilicon semiconductor layer on the semiconductor structure, and patterning the second layer;
    implanting impurity ions of a second conductivity type into said second polysilicon semiconductor layer;
    thermally heating the semiconductor structure resulting from the previous step to diffuse the impurity implanted in said second polysilicon semiconductor layer into said semiconductor region, so that a first region of the second conductivity type, which is in contact with said insulating layer and is between the insulating layer and the emitter forming region is formed in said semiconductor region, and to diffuse the impurity inplanted in said first polysilicon semiconductor layer into that portion of said second polysilicon semiconductor layer, to change the conductivity type of said portion of said first polysilicon semiconductor layer from said second conductivity type to said first conductivity type;
    removing said first polysilicon semiconductor layer and said portion of the first conductivity type of said second polysilicon semiconductor layer;
    thermally heating the semiconductor structure to form a second silicon dioxide layer on said first polysilicon layer to be thicker than said first silicon dioxide layer under said silicon nitride layer;
    removing said silicon nitride layer and said first silicon dioxide layer to expose said semiconductor region;
    forming a third polysilicon semiconductor layer on the semiconductor structure, and patterning the third layer;
    implanting impurity ions of the second conductivity type into said third polysilicon semiconductor layer, and thermally heating the third layer to diffuse the impurity implanted therein into said semiconductor region to form a second region of the second conductivity type acting as an active base region in contact with said first region of the second conductivity type; and
    forming a region of the first conductivity type acting as an emitter region in a part of said second region of the second conductivity type by implanting impurity ions of the first conductivity type into said third polysilicon semiconductor layer, and thermally heating the third structure.

2. A method of manufacturing a semiconductor device according to claim 1, in which said first and second conductivity types are N and P conductivity types, respectively, and said common etching is performed using KOH solution.

3. A method of manufacturing a semiconductor device according to claim 1, in which said first polysilicon semiconductor layer of the first conductivity type is prepared by implanting impurity ions of the first conductivity type into a polysilicon semiconductor layer.

4. A method of manufacturing a semiconductor device according to claim 3, in which said impurity ions of the first conductivity type are arsenic ions.

5. A method of manufacturing a semiconductor device according to claim 1, in which said second polysilicon semiconductor layer of the second conductivity type is prepared by implanting impurity ions of the second conductivity type into a polysilicon semiconductor layer.

6. A method of manufacturing a semiconductor device according to claim 5, in which said impurity ions of the second conductivity type are boron ions.

* * * * *